United States Patent
Kim et al.

(10) Patent No.: US 6,337,809 B1
(45) Date of Patent: Jan. 8, 2002

(54) SEMICONDUCTOR MEMORY DEVICE CAPABLE OF IMPROVING DATA PROCESSING SPEED AND EFFICIENCY OF A DATA INPUT AND OUTPUT PIN AND RELATED METHOD FOR CONTROLLING READ AND WRITE

(75) Inventors: Kun-tae Kim; Jung-bae Lee, both of Kyungki-do (KR)

(73) Assignee: Samsung Electronics, Co., Ltd., Suwon (KR)

( * ) Notice: Subject to any disclaimer, the term of this patent is extended or adjusted under 35 U.S.C. 154(b) by 0 days.

(21) Appl. No.: 09/543,759

(22) Filed: Apr. 5, 2000

(30) Foreign Application Priority Data

Apr. 6, 1999 (KR) ............................................ 99-11826

(51) Int. Cl.$^7$ ................................................ G11C 16/04
(52) U.S. Cl. .................. 365/189.05; 365/994; 365/221; 365/230.08; 365/233
(58) Field of Search ............................ 365/233, 189.05, 365/194, 221, 230.08

(56) References Cited

U.S. PATENT DOCUMENTS

| 5,404,480 | A | 4/1995 | Suzuki | 365/189.07 |
| 5,717,653 | A | 2/1998 | Suzuki | 365/233 |
| 5,838,631 | A | 11/1998 | Mick | 365/233 |
| 6,134,180 | A | 10/2000 | Kim et al. | 365/233 |

FOREIGN PATENT DOCUMENTS

| WO | WO 95/02248 | 1/1995 |
| WO | WO 96/30838 | 10/1996 |

*Primary Examiner*—Michael Lebentritt
*Assistant Examiner*—Vanthu Nguyen
(74) *Attorney, Agent, or Firm*—Volentine Francos, PLLC

(57) ABSTRACT

A semiconductor memory device is provided that is capable of increasing a data processing speed and the efficiency of a data input and output pin. A method is also provided for controlling the read and write of such a device. A data first-in first-out (FIFO) circuit temporarily stores write data when a read command is received during a write operation and outputs the stored write data to the memory cell array after a read operation is completed. An address FIFO circuit temporarily stores addresses corresponding to the write data when the read command is received during the write operation and outputs the stored addresses to the memory cell array after the read operation is completed. A control signal generator generates a plurality of control signals for controlling the data FIFO circuit and the address FIFO circuit in response to a write command and the read command. When the addresses received during the read operation coincide with the addresses stored in the address FIFO circuit, data is not output from the memory cell array, but instead, the write data stored in the data FIFO circuit is output. The number of write data items stored in the data FIFO circuit and the number of addresses stored in the address FIFO circuit vary according to the column address strobe (CAS) latency of the semiconductor memory device.

8 Claims, 8 Drawing Sheets

SEMICONDUCTOR MEMORY DEVICE CAPABLE OF IMPROVING DATA PROCESSING SPEED AND EFFICIENCY OF A DATA INPUT AND OUTPUT PIN AND RELATED METHOD FOR CONTROLLING READ AND WRITE

This application relies for priority upon Korean Patent Application No. 99-11826, filed on Apr. 6, 1999, the contents of which are herein incorporated by reference in their entirety.

BACKGROUND OF THE INVENTION

The present invention relates to a semiconductor memory device, and more particularly, to a double data rate synchronous DRAM (DDR SDRAM) and a method for controlling read and write operations of a DDR SRAM.

In a single data rate synchronous DRAM (SDR SDRAM), the input and output of data through a data input and output pin DQ is performed at the rising edge of a clock. In the DDR SDRAM, the input and output of data through The data input and output pin DQ is performed at the rising and falling edges of the clock.

In general, the amount of data processed in one clock cycle is called a prefetch unit. The prefetch unit of the SDR SDRAM is 1. The prefetch unit of the DDR SDRAM is 2. FIG. 1 is a timing diagram for comparing the data processing speed and the efficiency of the data input and output pin DQ in the SDR SDRAM with the data processing speed and the efficiency of the data input and output pin DQ in the DDR SDRAM. Here, a case where the CAS latency (CL) is 2.5 and the burst length (BL) is 4 is shown.

In an arithmetical sense, since a DDR SDRAM processes twice the data of a SDR SDRAM in one clock cycle, the processing speed of the DDR SDRAM should be double that of the SDR SDRAM. However, the processing speed of the DDR SDRAM is not double the processing speed of the SDR SDRAM. Namely, as shown in FIG. 1, in the DDR SDRAM, the read command (RD) should be received after write data $D_0$ through $D_3$ are completely written.

In other words, the read command RD should be received after the lapse of a write recovery time ($t_{WR}$), and read data $Q_0$ through $Q_3$ are output after the lapse of clock cycles corresponding to the CAS latency after the read command RD is received. Thus, the processing speed of the DDR SDRAM is not double the processing speed of the SDR SDRAM. Accordingly, the efficiency of the data input and output pin DQ in the DDR SDRAM is lower than the efficiency of the data input and output pin DQ in the SDR SDRAM. Referring to FIG. 1, the efficiency of the data input and output pin DQ in the SDR SDRAM is 67% and the efficiency of the data input and output pin DQ in the DDR SDRAM is 44%.

SUMMARY OF THE INVENTION

To solve the above problem, it is an object of the present invention to provide a DDR SDRAM capable of improving the data processing speed and the efficiency of The data input and output pin DQ.

It is another object of the present invention to provide a method for controlling the read and write of the DDR SDRAM that is capable of improving the data processing speed and the efficiency of the data input and output pin DQ.

Accordingly, to achieve the first object, the DDR SDRAM according to the present invention comprises a memory cell array storing memory data, a data storage circuit to temporarily store write data when a read command is received during a write operation and to output the stored write data to the memory cell array after a read operation is completed, an address storage circuit to temporarily store write addresses corresponding to the write data when the read command is received during the write operation and to output the stored write addresses to the memory cell array after the read operation is completed, and a control signal generator for generating a plurality of control signals for controlling the data storage circuit and the address storage circuit in response to a write command and the read command, wherein the write data stored in the data storage circuit is output when read addresses received during the read operation coincide with the write addresses stored in the address storage circuit.

Preferably, the data storage circuit and the address storage circuits are both first-in first-out buffers. In addition, the number of write data items stored in the data storage circuit preferably varies according to the CAS latency of the semiconductor memory device. Similarly, the number of addresses stored in the address storage circuit preferably varies according to the CAS latency of the semiconductor memory device.

The DDR SDRAM may also comprise a data input and output pin for providing the write data to the data storage circuit. In addition, the DDR SDRAM may also comprise a selector circuit connected to the memory array and the data storage circuit, for receiving the write data stored in the data storage circuit and outputting the received write data through the data input and output pin when the read addresses received during the read operation coincide with the write addresses stored in the address storage circuit, and for receiving the memory write data stored in the memory array and outputting the received memory data through the data input and output pin when the read addresses received during the read operation does not coincide with the write addresses stored in the address storage circuit.

To achieve the second object, the method for controlling the read and write of the DDR SDRAM according to the present invention comprises temporarily storing write data when a read command is received during a write operation and outputting the stored write data to the memory cell array after a read operation is completed, temporarily storing addresses corresponding to the write data when the read command is received during the write operation and outputting the stored addresses to the memory cell array after the read operation is completed, and comparing read addresses during the read operation with the stored addresses and outputting the stored write data rather than the data of the memory cell array when the read addresses during the read operation coincide with the stored addresses.

Preferably, the number of stored write data items and the number of stored addresses varies according to the CAS latency of the semiconductor memory device.

BRIEF DESCRIPTION OF THE DRAWINGS

The above objects and advantages of the present invention will become more apparent by describing in detail a preferred embodiment thereof with reference to the attached drawings in which.

DESCRIPTION OF THE PREFERRED EMBODIMENTS

Preferred embodiments of the present invention will be described below in detail, with reference to the attached drawings.

Figure 1:
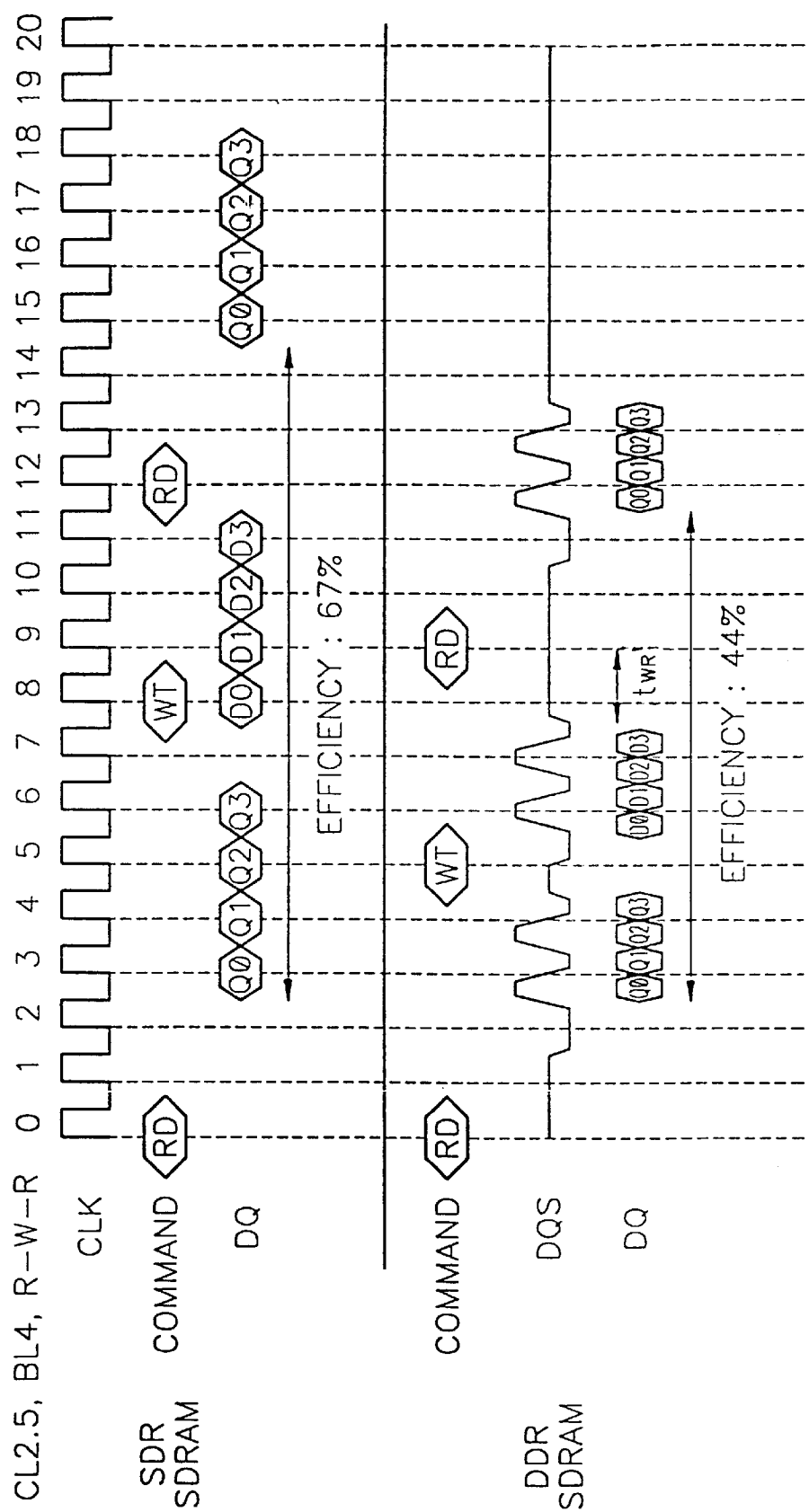
FIG. 1 is a timing diagram for comparing the data processing speed and the to efficiency of a data input and output pin (DQ) in an SDR SDRAM with the data processing speed and the efficiency of the data input and output pin in a DDR SDRAM.
Figure 2:
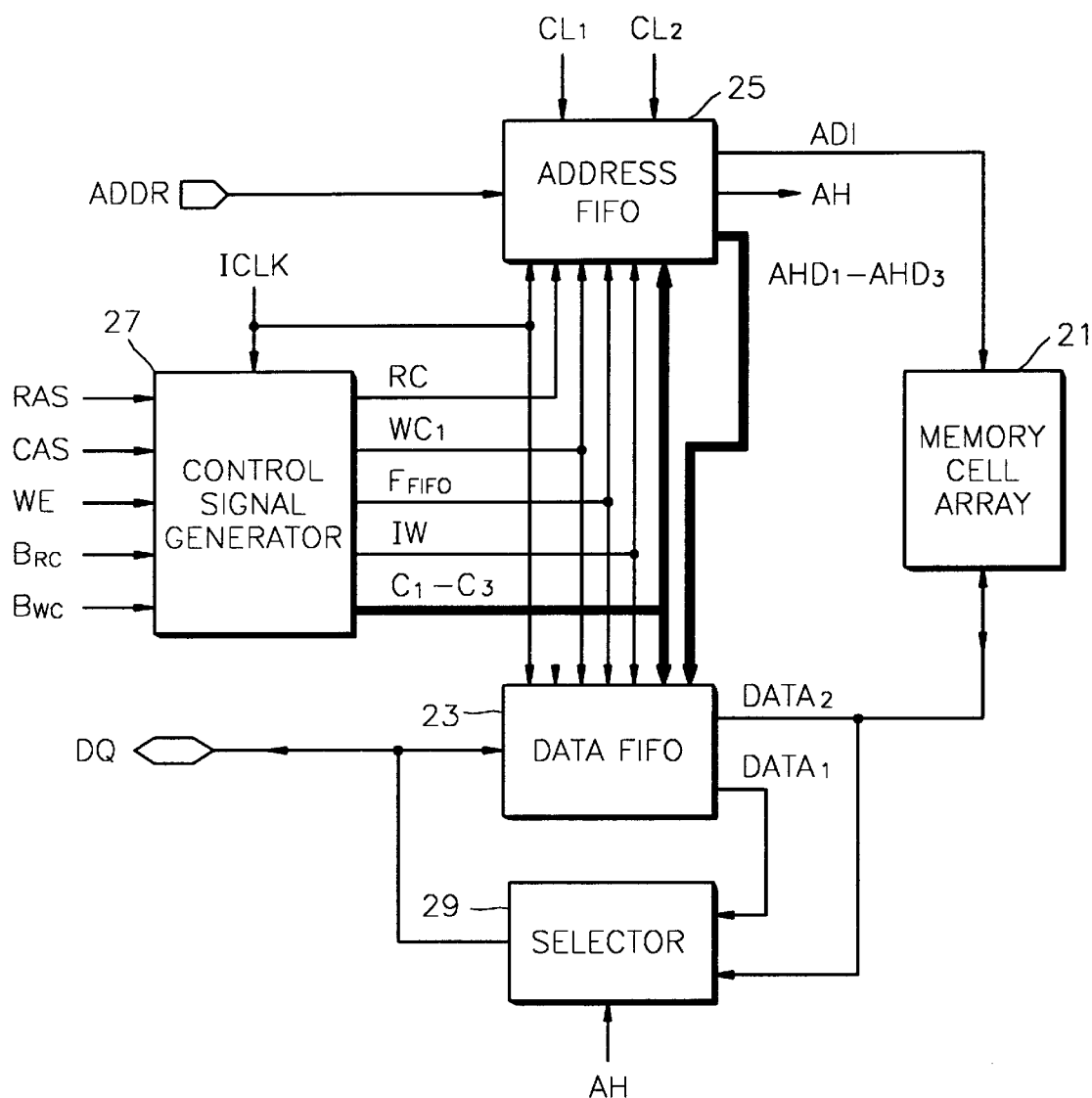
FIG. 2 is a block diagram of the DDR SDRAM according to a preferred embodiment of the present invention.

Referring to FIG. 2, a DDR SDRAM according to the present invention includes a memory cell array 21, a data first-in first-out (FIFO) circuit 23, an address FIFO buffer 25, a control signal generator 27, and a selector 29. The DDR SDRAM according to the present invention is constituted so as to have the same CAS latency (or CAS latency-1) in a write command as the CAS latency in a read command.

The control signal generator 27 generates a plurality of control signals including a read control signal RC, a first write control signal $WC_1$, a FIFO flag signal $F_{FIFO}$, an internal write signal IW, and first through third count signals $C_1$ to $C_3$, all for controlling the data FIFO buffer 23 and the address FIFO buffer 25 in response to an internal clock signal ICLK, while receiving a write command and a read command, to be specific, input signals RAS, CAS, WE, $B_{RC}$, and $B_{WC}$. The input signal RAS is the inverted signal of a row address strobe signal (/RAS) received from the outside. The input signal CAS is the inverted signal of a column address strobe signal (/CAS) received from the outside. The input signal WE is the inverted signal of a write enable signal (/WE) received from the outside. The input signal $B_{RC}$ is enabled when a burst read is completed. The input signal $B_{WC}$ is enabled when a burst write is completed.

Here, the write command means that the signal /RAS is received in a logic "high" state, that the signal /CAS is received in a logic "low" state, and that the signal /WE is received in a logic "high" state. Also, the read command means that the signal /RAS is received in the logic "high" state, that the signal /CAS is received in the logic "low" state, and that the signal /WE is received in the logic "low" state.

The data FIFO buffer 23 which is a data storage means, sequentially stores the write data received through a data input and output pin DQ in response to the control signals RC, $F_{FIFO}$, $WC_1$, and $C_1$ to $C_3$, the internal clock ICLK, and the address hit data signals $AH_1$ to $AH_3$ generated by the address FIFO buffer 25. The data FIFO buffer 23 sequentially outputs the stored write data to the memory cell array 21 in order to continue a write operation after a read operation is completed, when the read command is input to the control signal generator 27 after the write command is input to the same.

The selector 29 which is an output multiplexer selects the data stored in the data FIFO buffer 23 and outputs the selected data through the data input and output pin DQ, in response to the address hit signal AH generated by the address FIFO buffer 25, when the addresses during the read operation coincide with the addresses stored in the address FIFO buffer 25.

Though not shown here, in the write data path from the data input and output pin DQ to the memory cell array 21, an input buffer, an input multiplexer, and a data input and output line driver are interposed between the data input and output pin DQ and the data FIFO buffer 23. An input and output line driver is interposed between the data FIFO buffer 23 and the memory cell array 21. Also, in the read data path from the memory cell array 21 to the data input and output pin DQ, an input and output line multiplexer and an input and output line sense amplifier are interposed between the memory cell array 21 and the selector 29. An output buffer is interposed between the selector 29 and the data input and output pin DQ.

Figure 3:
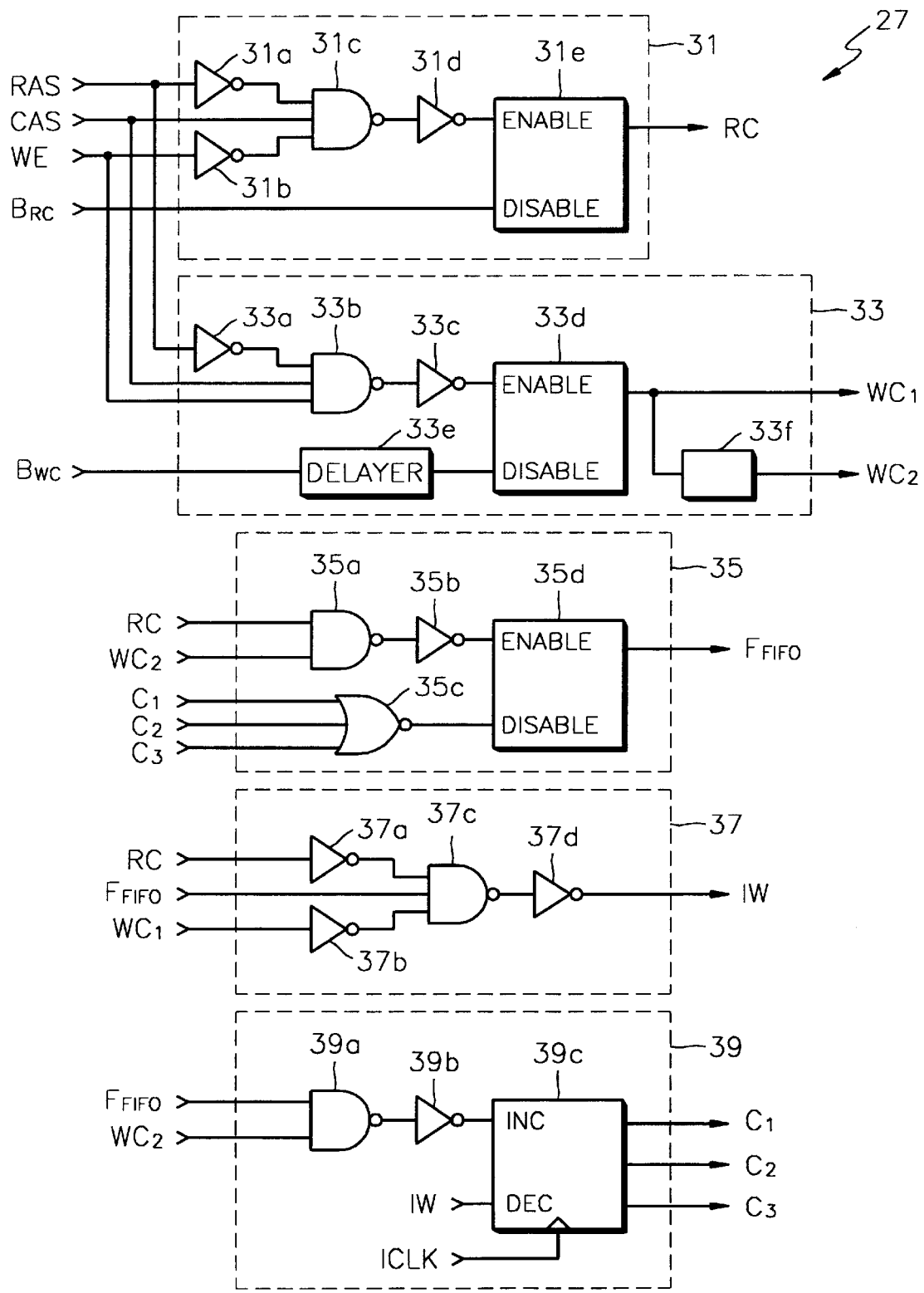
FIG. 3 is a detailed circuit diagram of the control signal generator shown in FIG. 2.

FIG. 3 is a detailed circuit diagram of the control signal generator 27 shown in FIG. 2.

Referring to FIG. 3, the control signal generator includes a read command signal generator 31, a write command signal generator 33, a FIFO flag signal generator 35, an internal write signal generator 37, and a FIFO counter 39.

The read command signal generator 31 generates a read command signal RC which is enabled when the read command is received. In other words, the read command signal RC is enabled when the input signal RAS becomes logic "low," the input signal CAS becomes logic "high," and the input signal WE becomes logic "low." The read command signal is disabled when the burst read is completed, i.e., when the input signal $B_{RC}$ is enabled. The read command signal generator 31 includes first through third inverters 31a, 31b, and 31d, a NAND gate 31c, and a controller 31e. The read command signal generator 31 can include other logic gates, if necessary.

The write command signal generator 33 generates a first write command signal $WC_1$ which is enabled when the write command is received. In other words, the first write command signal $WC_1$ is enabled when the input signal RAS becomes logic "low," the input signal CAS becomes logic "high," and the signal WE becomes logic "high." The first write command signal $WC_1$ is disabled after the lapse of delay time corresponding to the CAS latency, from the point of time where the burst write is completed, i.e., from the point of time where the signal $B_{WC}$ is enabled. The write command signal generator 33 generates a second write command signal $WC_2$ whose enable point of time, i.e., the time at which it goes high, is delayed with respect to the enable point of time of the first write command signal $WC_1$ by the CAS latency, and whose disable point of time, i.e., the time at which it goes low, is the same as the disable point of time of the first write command signal $WC_1$. The write command signal generator 33 includes first and second inverters 33a and 33c, a NAND gate 33b, a first controller 33d, a delayer 33e, and a second controller 33f. The write command signal generator 33 can include other logic gates, if necessary.

The FIFO flag signal generator 35 generates a FIFO flag signal $F_{FIFO}$ that indicates whether there is data in the data FIFO buffer 23 shown in FIG. 2. The FIFO flag signal $F_{FIFO}$ is enabled when the read command is received while the second write command signal $WC_2$ is enabled to logic "high," i.e., when the read command signal RC is enabled to logic "high." The FIFO flag signal $F_{FIFO}$ is disabled when there is no data in the data FIFO buffer 23, i.e., when the count signals $C_1$, $C_2$, and $C_3$ are all logic "low." The FIFO flag signal generator 35 includes a NAND gate 35a, an inverter 35b, a NOR gate 35c, and a controller 35d. The FIFO flag signal generator 35 can include other logic gates, if necessary.

The internal write signal generator 37 generates an internal second write command signal $WC_2$, which indicates that the internal write can be performed. The internal second write command signal $WC_2$ is enabled when there is data in the data FIFO buffer 23 (the signal $F_{FIFO}$ is logic "high"), the read operation is completed (the signal RC is logic "low"), and all write data items are input to the data FIFO buffer 23 (the first write command signal $WC_1$ is logic "low"). The internal second write command signal $WC_2$ is disabled when there is no data in the data FIFO buffer 23 (the FIFO flag signal $F_{FIFO}$ is logic "low"), the read operation is not completed (the read control signal RC is logic "high"), and not all the write data items are input to the data FIFO buffer 23 (the first write command signal $WC_1$ is logic "high"). The internal write signal generator 37 includes first through third inverters 37a, 37b, and 37d, and a NAND gate 37c. The internal write signal generator 37 can include other logic gates, if necessary.

The FIFO counter 39 generates the count signals $C_1$, $C_2$, and $C_3$ and is controlled by the second write command signal $WC_2$ to count the number of write data items to be stored in the data FIFO buffer 23. When the number of write data items to be stored in the data FIFO buffer 23 is 1, $C_1$, $C_2$, and $C_3$ are respectively 1, 0, and 0. When the number of write data items to be stored in the data FIFO buffer 23 is 2, $C_1$, $C_2$, and $C_3$ are respectively 1, 1, and 0. When the number of write data items to be stored in the data FIFO buffer 23 is 3, $C_1$, $C_2$, and $C_3$ are respectively 1, 1, and 1. The count signals $C_1$, $C_2$, and $C_3$ increase in response to the internal clock signal ICLK when the second write command signal $WC_2$ is logic "high" and the FIFO flag signal $F_{FIFO}$ is logic "high," and decrease in response to the internal clock signal ICLK when the internal write signal IW is logic "high." The FIFO counter 39 includes a NAND gate 39a, an inverter 39b, and a counter 39c. The FIFO counter can include other logic gates as necessary.

Figure 4:
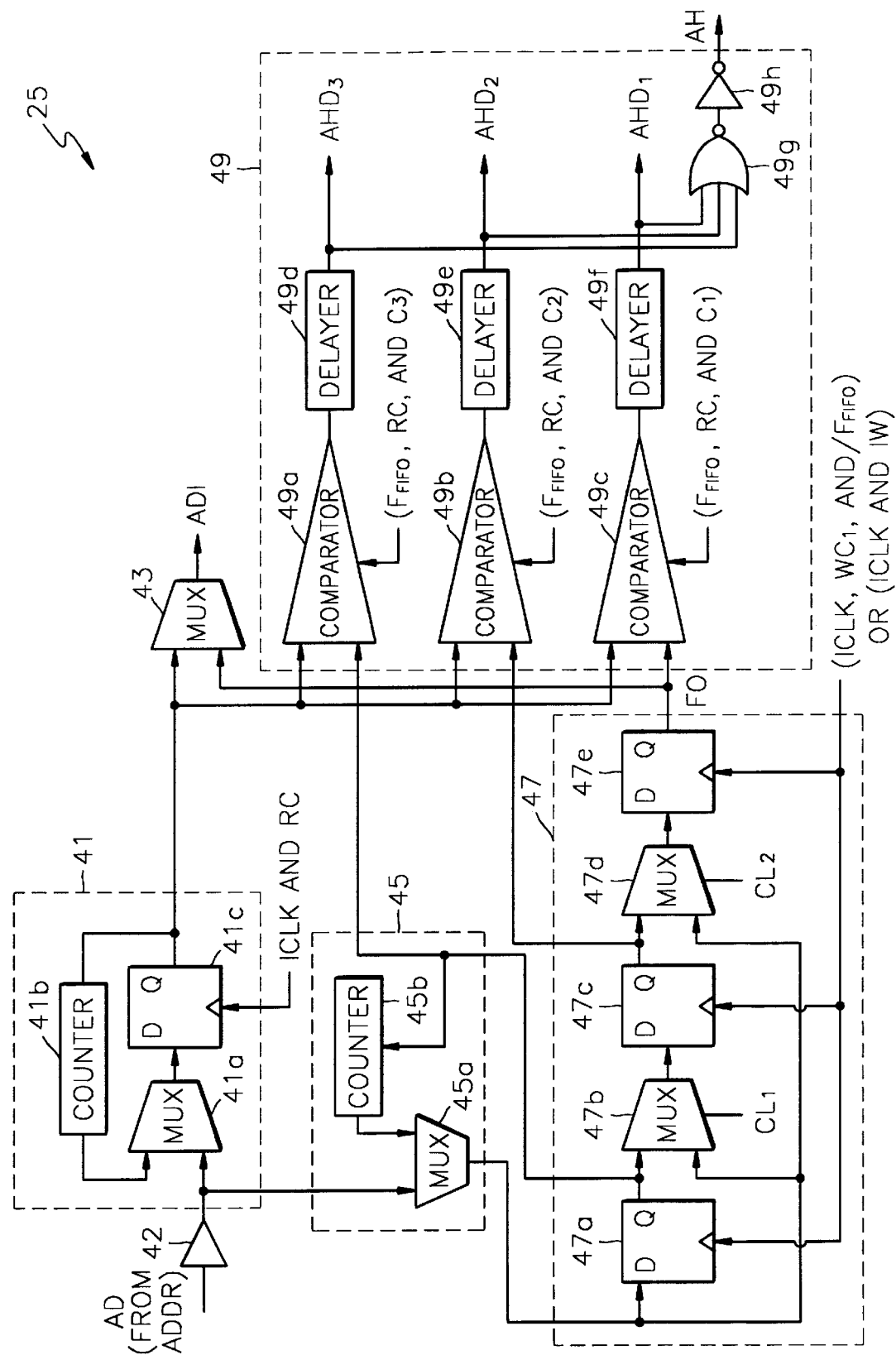
FIG. 4 is a detailed circuit diagram of the address first-in first-out (FIFO) circuit and related circuits shown in FIG. 2.

FIG. 4 is a detailed circuit diagram of the address FIFO buffer 25. The FIFO buffer 25 includes a first address counter 41, a multiplexer 43, a second address counter 45, an address FIFO circuit 47, and a comparing unit 49.

Referring to FIG. 4, the address FIFO circuit 47 includes a plurality of D flip-flops 47a, 47c, and 47e and a plurality of multiplexers 47b and 47d. The D flip-flops 47a, 47c, and 47e operate in response to the internal clock signal ICLK. The number of addresses stored in the address FIFO circuit 47, i.e., the number of stages of the address FIFO circuit 47 varies according to the CAS latency. Since the CAS latency is usually up to 3, FIG. 4 shows the case where the depth of the address FIFO circuit 47 is 3. The depth of the address FIFO circuit 47 can be extended, if necessary, however, through the addition of more D flip-flops and multiplexers.

During the read operation (when the read command signal RC is logic "high") the first address counter 41 receives the address AD input through the address pin ADDR shown in FIG. 2 and generates an internal address. The internal address is output through the multiplexer 43 as an address ADI. The address ADI is then transmitted to the address decoder (not shown) of the memory cell array shown in FIG. 2.

The address FIFO circuit 47 operates during a normal write operation (when the first write control signal $WC_1$ is logic "high" and the signal $F_{FIFO}$ is logic "low") or an internal write operation (when the internal write signal IW is logic "high"). In other words, when the CAS latency is 3 (control signals $CL_1$ and $CL_2$ both become logic "0"), during the normal write operation, the internal address generated by the second address counter 45 is output to an output stage FO, after sequentially passing through the three stages of the address FIFO circuit 47, i.e., after sequentially passing through the flip-flop 47a, the multiplexer 47b, the flip-flop 47c, the multiplexer 47d, and the flip-flop 47e. When the CAS latency is 2 (the control signals $CL_1$ and $CL_2$ become logic "0" and logic "1," respectively), the internal address generated by the second address counter 45 is output to the output stage FO, after sequentially passing through two stages of the address FIFO circuit 47, i.e., after sequentially passing through the multiplexer 47b, the flip-flop 47c, the multiplexer 47d, and the flip-flop 47e. When the CAS latency is 1 (the control signals $CL_1$ and $CL_2$ become logic "1" and logic "0," respectively), the internal address generated by the second address counter 45 is output to the output stage FO, after passing through one stage of the address FIFO circuit 47, i.e., after sequentially passing through the multiplexer 47d and the flip-flop 47e. The internal address output to the output stage FO is output as the address ADI through the multiplexer 43. The address ADI is transmitted to the address decoder of the memory cell array shown in FIG. 2.

When the read command is received during a write operation, the $F_{FIFO}$ becomes logic "high." Accordingly, the operation of the address FIFO circuit 47 stops and the internal address input to the address FIFO circuit 47 is stored. After the read operation is completed, during the internal write operation, the internal write signal IW becomes logic "high." Accordingly, the operation of the address FIFO circuit 47 resumes and the addresses stored in the address FIFO circuit 47 are sequentially output to the output stage FO. The address output to the output stage FO is output as the address ADI through the multiplexer 43. The address ADI is then transmitted to the address decoder of the memory cell array shown in FIG. 2.

When the read command is received (the signal RC is logic "high") and when the FIFO flag signal $F_{FIFO}$ is logic "high" (there is data in the data FIFO buffer 23 shown in FIG. 2), the comparing unit 49 compares the address during the read operation, i.e., the output of the first address counter 41, with the corresponding address in the address FIFO circuit 47 and generates signals $AHD_1$ to $AHD_3$.

More specifically, a first comparator 49a compares the output of the first address counter 41 with an address stored in the third stage of the address FIFO circuit 47, i.e., the flip-flop 47a, in response to the third count signal $C_3$, and enables the signal $AHD_3$ to logic "high" when the output coincides with the address. A second comparator 49b compares the output of the first address counter 41 with an address stored in the second stage of the address FIFO circuit 47, i.e., the flip-flop 47c, in response to the second count signal $C_2$, and enables the signal $AHD_2$ to logic "high" when the output coincides with the address. A third comparator 49c compares the output of the first address counter 41 with an address stored in the first stage of the address FIFO circuit 47, i.e., the flip-flop 47e, in response to the first count signal $C_1$, and enables the signal $AHD_1$ to logic "high" when the output coincides with the address. When one of the signals $AHD_1$ to $AHD_3$ is enabled to logic "high," the address hit signal AH is enabled to logic "high" by a NOR gate 49g and an inverter 49h.

Figure 5:
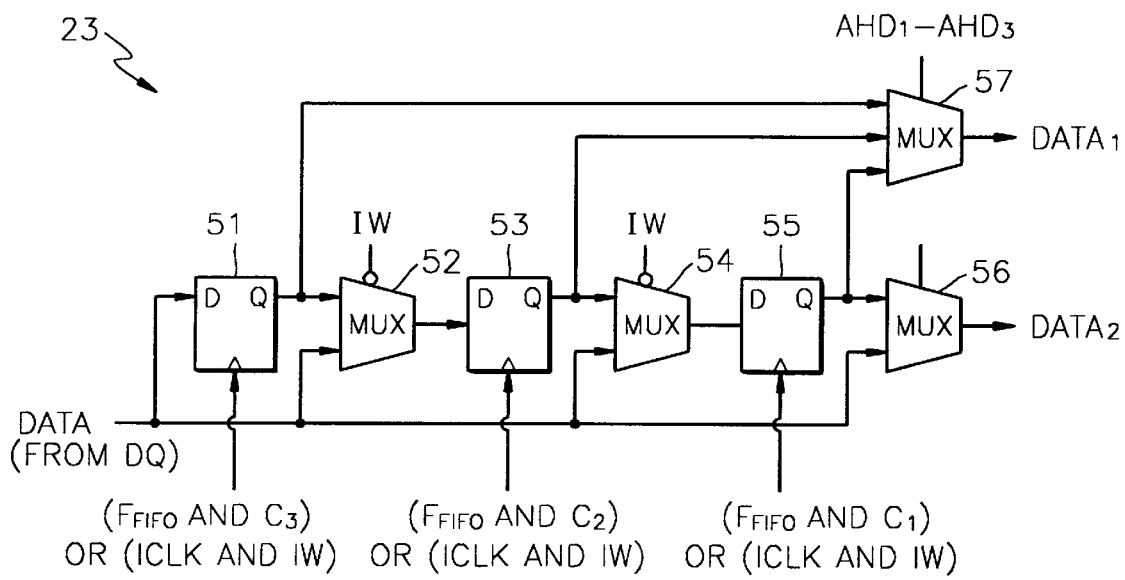
FIG. 5 is a detailed circuit diagram of the data FIFO circuit shown in FIG. 2.

FIG. 5 is a detailed circuit diagram of the data FIFO buffer 23 shown in FIG. 2.

Referring to FIG. 5, the data FIFO buffer 23 includes first through fourth data multiplexers 52, 54, 56, and 57 and first through third data D flip-flops 51, 53, and 55 which operate in response to the internal clock ICLK. FIG. 5 shows a case where the depth of the data FIFO buffer 23 is 3 stages. The depth of the data FIFO buffer 23 can be extended, however, if necessary, with additional multiplexers and D flip flops. Also, the number of data FIFO circuits 23 is determined according to the unit of the prefetch. Since the prefetch of the DDR SDRAM is 2, two data FIFO circuits 23 are necessary.

During a normal write operation, since the signal $WC_1$ becomes logic "high" and the signal $F_{FIFO}$ becomes logic "low," the write data DATA input through the input and output pin DQ is output as data $DATA_2$ through the multiplexer 56. The data $DATA_2$ is then transmitted to the memory cell array shown in FIG. 2.

When the read command is received during the write operation, the signal $F_{FIFO}$ becomes logic "high," thus operating the FIFO counter 39 shown in FIG. 3. At this time, when the number of write data items to be stored in the data FIFO is 1, the outputs $C_1$, $C_2$, and $C_3$ of the FIFO counter 39 are 1, 0, and 0, respectively. Accordingly, the one item of write data DATA received through the input and output pin DQ is stored in the flip-flop 55 through the multiplexer 54. When the number of write data items to be stored in the data FIFO is 2, the outputs $C_1$, $C_2$, and $C_3$ of the FIFO counter 39 are 1, 1, and 0, respectively. Accordingly, the first write data item of the two write data items DATA received through the input and output pin DQ is stored in the third flip-flop 55 through the second multiplexer 54. The second write data item is stored in the second flip-flop 53 through the first multiplexer 52. When the number of write data items to be stored in the data FIFO is 3, the outputs $C_1$, $C_2$, and $C_3$ of the FIFO counter 39 are 1, 1, and 1, respectively. Accordingly, the first write data item among the three write data items DATA received through the input and output pin DQ is stored in the third flip-flop 55 through the second multiplexer 54; the second write data item is stored in the second flip-flop 53 through the first multiplexer 52; and the third write data item is directly stored in the first flip-flop 51. The number of write data items to be stored in the data FIFO varies according to the CAS latency.

When the address hit is generated during the read operation at a time when there is write data in the data FIFO buffer 23, one among the data items stored in the flip-flops 51, 53, and 55 is selected in response to the signals $AHD_1$ to $AHD_3$ and is output as data $DATA_1$ through the multiplexer 57. To be more specific, when the signal $AHD_1$ becomes logic "high," the data item stored in the third flip-flop 55 is output as the data $DATA_1$ through the multiplexer 57; when the signal $AHD_2$ becomes logic "high," the data item stored in the second flip-flop 53 is output as the data $DATA_1$ through the multiplexer 57; and when the signal $AHD_3$ becomes logic "high," the data item stored in the first flip-flop 51 is output as the data $DATA_1$ through the multiplexer 57. At this time, since the address hit signal AH is enabled to logic "high," the data $DATA_1$ is output to the input and output pin DQ through the selector 29 shown in FIG. 2.

FIGS. 6A through 6D are timing diagrams of the operation of the DDR SDRAM according to a preferred embodiment of the present invention. The operation of the DDR SDRAM according to the preferred embodiment of the present invention will be described in more detail with reference to FIGS. 6A through 6D.

Figure 6A:
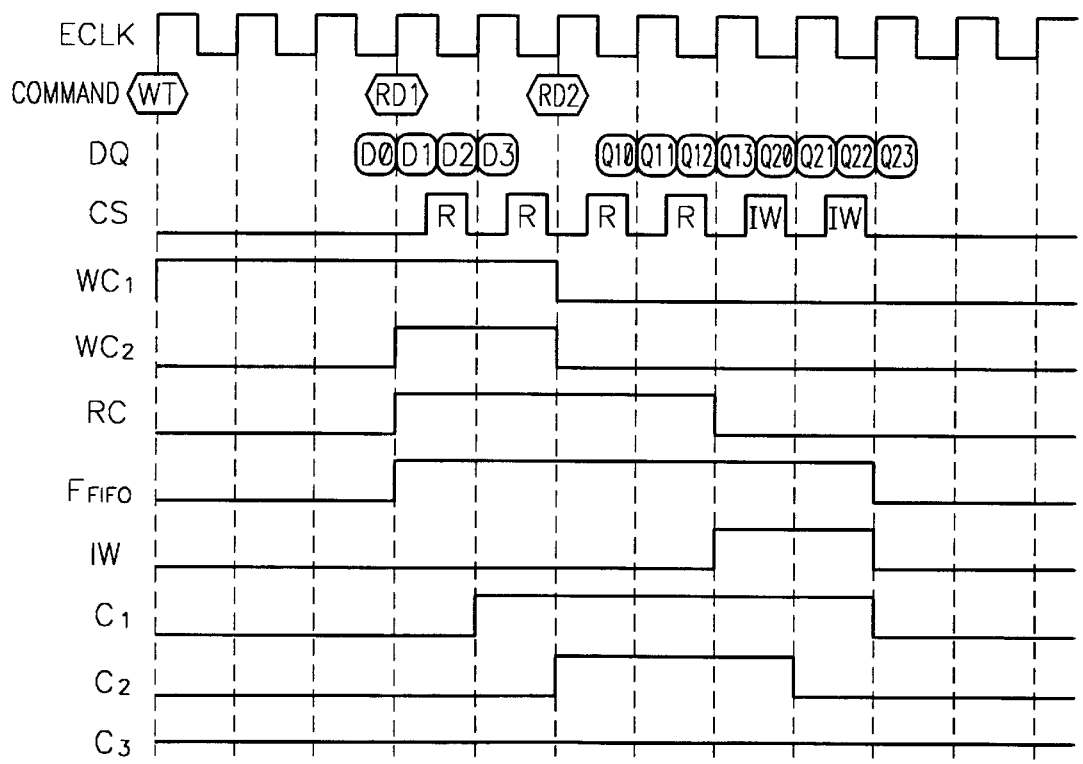
FIGS. 6A through 6D are timing diagrams showing the operations of the DDR SDRAM according to a preferred embodiment of the present invention, shown in FIG. 2.
Figure 6B:
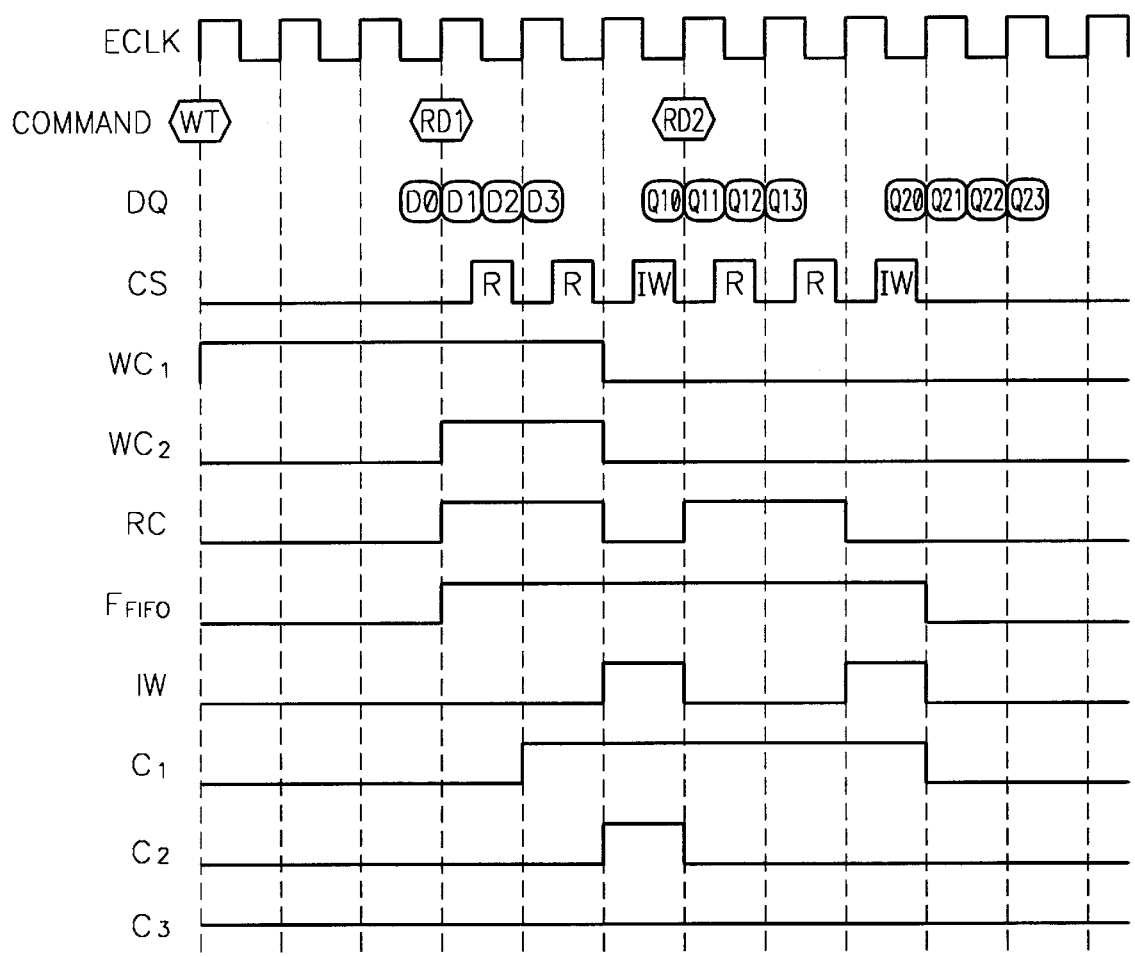

FIGS. 6A and 6B are timing diagrams of the operation of the DDR SDRAM when the CAS latency is 2.5 and the burst length is 4. The signal ECLK represents the external clock signal.

Referring to FIG. 6A, a first read command $RD_1$ is received when write data $D_0$ is received after the lapse of the CAS latency, which occurs 2.5 clock cycles after the rising edge of the external clock signal ECLK with which the write command WT coincides, i.e., after the falling edge of the third clock cycle of the external clock ECLK. A second read command $RD_2$ is received 1.5 clock cycles after the rising edge of the external clock signal ECLK with which the first read command $RD_1$ coincides, i.e. after the falling edge of the fifth clock cycle of the external clock ECLK.

In this case, two pairs of write data items $D_0/D_1$ and $D_2/D_3$ are stored in the two data FIFO circuits 23. Two pairs of output data items $Q_{10}/Q_{11}$ and $Q_{12}/Q_{13}$ are output from the memory cell array 21 after the lapse of 2.5 clock cycles after the first read command $RD_1$ is received. In continuation, two pairs of output data items $Q_{20}/Q_{21}$ and $Q_{22}/Q_{23}$ are output from the memory cell array 21 after the lapse of 2.5 clock cycles after the second read command $RD_2$ is received.

After the read operation is completed, the two pairs of write data items $D_{0/D1}$ and $D_2/D_3$ stored in the two data FIFO circuits 23 are written to the memory cell array 21 by the internal write operation. The above operation order is shown in a column selection signal CS. R refers to the read operation. IW refers to the internal write operation. Since the column selection signal CS is widely known to anyone skilled in the art, a detailed description thereof will be omitted.

Referring to FIG. 6B, the first read command $RD_1$ is received when the write data $D_0$ is received after the lapse of the CAS latency, which is 2.5 clock cycles after the rising edge of the external clock signal with which WT coincides, i.e., after the falling edge of the third clock cycle of the external clock ECLK. The second read command $RD_2$ is received 2.5 clock cycles after the rising edge of the external clock signal with which the first read command $RD_1$ coincides, i.e., after the falling edge of the sixth clock cycle of the external clock ECLK.

In this case, since there is a temporal gap of one clock cycle between the two read commands $RD_1$ and $RD_2$, i.e., a gap of two read operations, the internal write operation is performed between the two read operations.

Figure 6C:
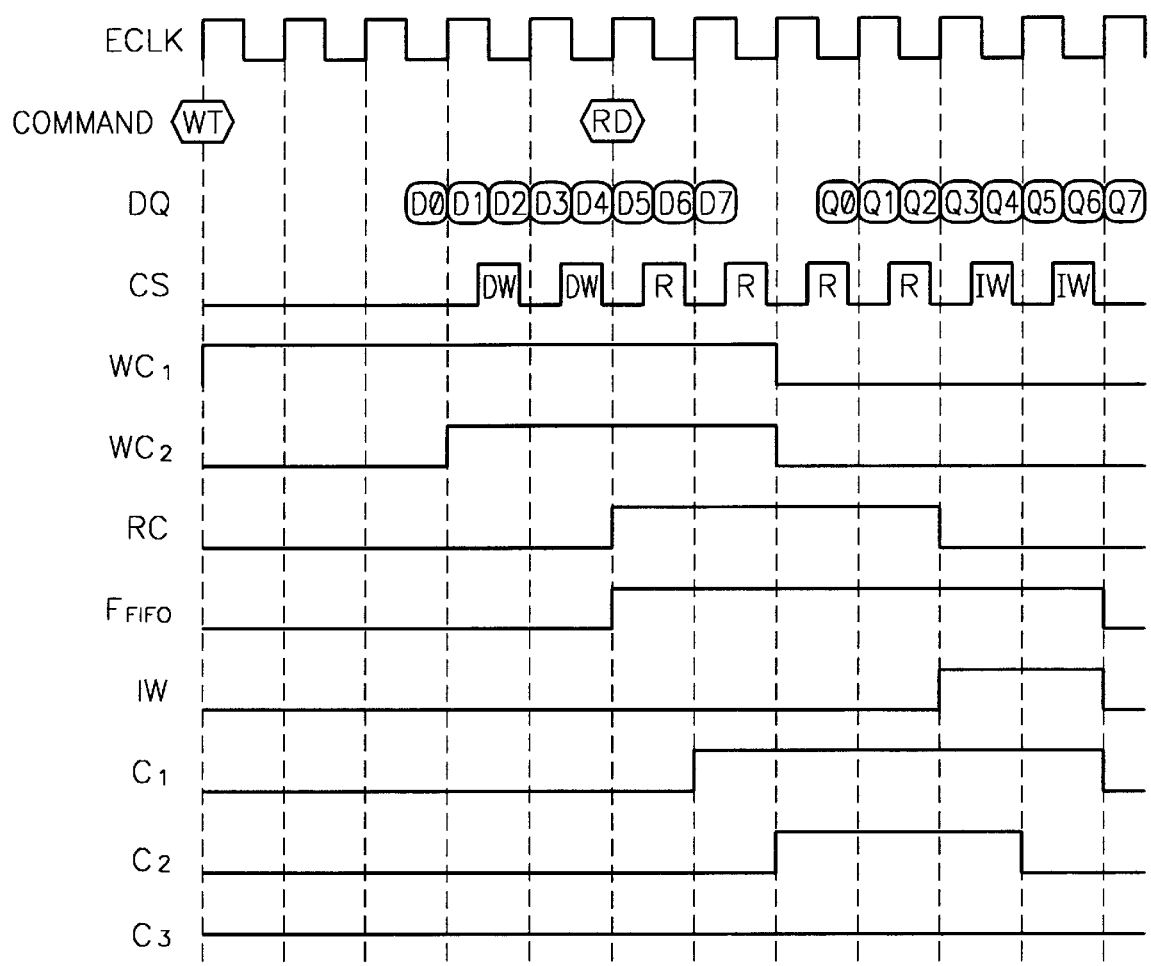

FIG. 6C is a timing diagram of the operation of the DDR SDRAM when the CAS latency is 2.5 and the burst length is 8.

Referring to FIG. 6C, write data $D_0$ through $D_3$ are received after the lapse of the CAS latency, i.e., 2.5 clock cycles after the write command WT is received. The read command RD is received when write data $D_4$ is received. In this case, the write data $D_0$ through $D_3$ are directly written to the memory cell array 21. The two pairs of write data items $D_4/D_5$ and $D_6/D_7$ received after the write data $D_0$ through $D_3$, are stored in the two data FIFO circuits 23. Four pairs, i.e., eight output data items $Q_0$ through $Q_7$, are output from the memory cell array 21 after the lapse of 2.5 clock cycles after the read command RD is received.

After the read operation is completed, the two pairs of write data $D_4/D_5$ and $D_6/D_7$ stored in the data FIFO circuits 23 are written to the memory cell array 21 by the internal write operation. The above operation order is shown in the column selection signal CS. R refers to the read operation. DW refers to a direct write operation. IW refers to the internal write operation.

Figure 6D:
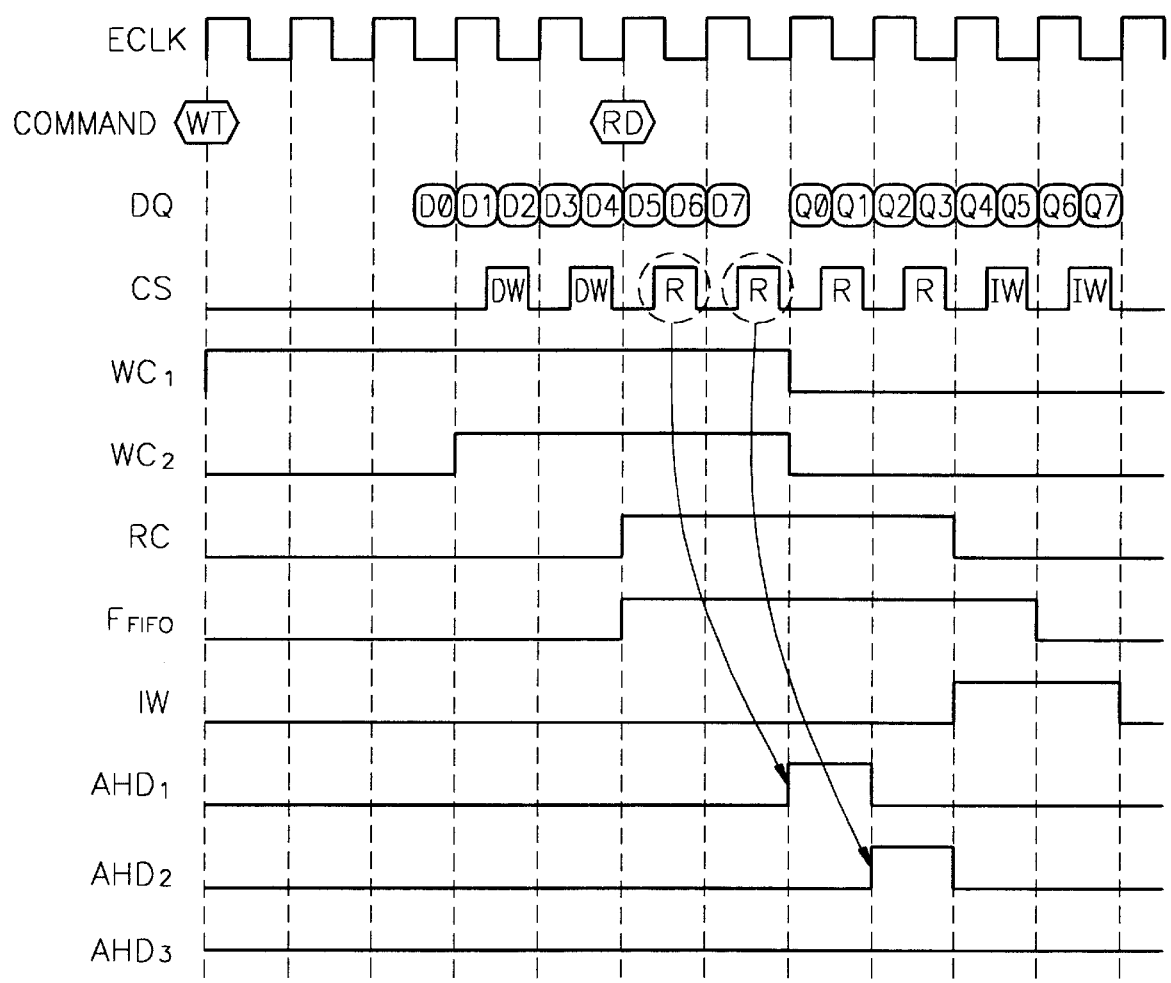

FIG. 6D is a timing diagram of the operation of the DDR SDRAM when the CAS latency is 2.5, the burst length is 8, and the address hit is generated.

Referring to FIG. 6D, write data $D_0$ through $D_3$ are received after the lapse of the CAS latency, that is, 2.5 clock cycles after the write command WT is received. In this case, the write data items $D_0$ through $D_3$ are directly written to the memory cell array 21. The two pairs of write data items $D_4/D_5$ and $D_6/D_7$ received after the write data items $D_0$ through $D_3$ are stored in the two data FIFO circuits 23. Four pairs, i.e., eight output data items $Q_0$ through $Q_7$, are output from the memory cell array 21 after the lapse of 2.5 clock cycles after the read command RD is received.

However, when the address hit is generated during the read operation, for example, when the address stored in the first stage of the address FIFO circuit 47 is address hit, data is not output from the memory cell array 21 and the write data items $D_4/D_5$ stored in the first stage of the two data FIFO circuits 23 are output as the output data items $Q_0/Q_1$. When the address stored in the second stage of the address FIFO circuit 47 is address hit, the write data items D6/D7 stored in the second stage of the two data FIFO circuits 23 are output as the output data items $Q_2/Q_3$. The remaining output data items $Q_4$ through $Q_7$ are output from the memory cell array 21. After the read operation is completed, the two pairs of write data items $D_4/D_5$ and $D_6/D_7$ stored in the data FIFO are written to the memory cell array 21 by the internal write operation.

Since the DDR SDRAM according to the present invention includes the data FIFO buffer 23 and the address FIFO buffer 25 and has the same CAS latency (or CAS latency-1) in the write command and the read command, the read command can be received during the write operation. Accordingly, it is possible to improve the data processing speed and to improve the efficiency of the input and output pin DQ.

Although, the invention has been described with reference to a particular embodiment, it will be apparent to one of ordinary skill in the art that modifications of the described embodiment may be made without departing from the spirit and scope of the invention.

What is claimed is:

1. A semiconductor memory device, comprising:

a memory cell array storing memory data;

a data storage circuit to temporarily store write data when a read command is received during a write operation and to output the stored write data to the memory cell array after a read operation is completed;

an address storage circuit to temporarily store write addresses corresponding to the write data when the read command is received during the write operation and to output the stored write addresses to the memory cell array after the read operation is completed; and a control signal generator for generating a plurality of control signals for controlling the data storage circuit and the address storage circuit in response to a write command and the read command, wherein the write data stored in the data storage circuit is output when read addresses received during the read operation coincide with the write addresses stored in the address storage circuit, and wherein the number of write addresses stored in the address storage circuit varies according to a CAS latency of the semiconductor memory device.

2. The semiconductor memory device, as recited in claim 1, wherein the data storage circuit is a first-in first-out buffer.

3. The semiconductor memory device, as recited in claim 1, wherein the number of write data items stored in the data storage circuit varies according to the CAS latency of the semiconductor memory device.

4. The semiconductor memory device, as recited in claim 1, wherein the address storage circuit is a first-in first-out buffer.

5. The semiconductor memory device, as recited in claim 1, further comprising a data input and output pin for providing the write data to the data storage circuit.

6. The semiconductor memory device, as recited in claim 5, further comprising a selector circuit connected to the memory array and the data storage circuit, for receiving the write data stored in the data storage circuit and outputting the received write data through the data input and output pin when the read addresses received during the read operation coincide with the write addresses stored in the address storage circuit, and for receiving the memory write data stored in the memory array and outputting the received memory data through the data input and output pin when the read addresses received during the read operation does not coincide with the write addresses stored in the address storage circuit.

7. A method for controlling the read and write of a semiconductor memory device including a memory cell array, comprising:

temporarily storing write data when a read command is received during a write operation and outputting the stored write data to the memory cell array after a read operation is completed;

temporarily storing addresses corresponding to the write data when the read command is received during the write operation and outputting the stored addresses to the memory cell array after the read operation is completed; and comparing read addresses during the read operation with the stored addresses and outputting the stored write data rather than the data of the memory cell array when the read addresses during the read operation coincide with the stored addresses, wherein the number of stored addresses varies according to a CAS latency of the semiconductor memory device.

8. The method for controlling the read and write of a semiconductor memory device, as recited in claim 7, wherein the number of stored write data items varies according to the CAS latency of the semiconductor memory device.

* * * * *